(12) United States Patent
Kuker et al.

(10) Patent No.: US 12,126,955 B1
(45) Date of Patent: Oct. 22, 2024

(54) DYNAMIC CABIN DIGITAL HEADPHONE JACK

(71) Applicant: Rockwell Collins, Inc., Cedar Rapids, IA (US)

(72) Inventors: Anthony D. Kuker, Cedar Rapids, IA (US); Christopher M. Avgenackis, North Liberty, IA (US); Stephanie L. Cooper, Marion, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 197 days.

(21) Appl. No.: 17/965,402

(22) Filed: Oct. 13, 2022

Related U.S. Application Data

(60) Provisional application No. 63/255,476, filed on Oct. 14, 2021, provisional application No. 63/255,552, filed on Oct. 14, 2021, provisional application No. 63/255,515, filed on Oct. 14, 2021.

(51) Int. Cl.
| | |
|---|---|
| *H04R 1/10* | (2006.01) |
| *H03M 1/66* | (2006.01) |
| *H04R 5/033* | (2006.01) |
| *H04R 5/04* | (2006.01) |

(52) U.S. Cl.
CPC ............ *H04R 1/1066* (2013.01); *H03M 1/66* (2013.01); *H04R 5/033* (2013.01); *H04R 5/04* (2013.01)

(58) Field of Classification Search
CPC ............... H04R 2499/13; H04R 5/033; H04R 2420/09; H04R 3/00; H04R 5/04; H04R 1/1066; B64D 11/0015; B64D 11/00155; B64D 11/0624; H03M 1/66
USPC ............................ 381/370, 74, 86, 384, 71.4
See application file for complete search history.

(56) References Cited

U.S. PATENT DOCUMENTS

| | | | |
|---|---|---|---|
| 5,617,331 | A | 4/1997 | Wakai et al. |
| 5,710,821 | A * | 1/1998 | Cheah .................. G06F 1/181 381/345 |
| 7,028,304 | B1 | 4/2006 | Weinberger et al. |
| 7,343,157 | B1 | 3/2008 | Mitchell |
| 7,970,019 | B2 | 6/2011 | Shay et al. |
| 8,436,825 | B2 | 5/2013 | Coni et al. |
| 8,489,276 | B2 | 7/2013 | Callahan et al. |

(Continued)

FOREIGN PATENT DOCUMENTS

| | | |
|---|---|---|
| AU | 2002357727 A1 | 6/2003 |
| AU | 2014274529 B2 | 7/2018 |

(Continued)

*Primary Examiner* — Norman Yu
(74) *Attorney, Agent, or Firm* — Suiter Swantz IP

(57) ABSTRACT

A cabin management system is described. The cabin management system includes a housing. The housing is configured to receive one or more modules. The modules may be detached and reattached to the housing. The modules may be rearranged to achieve a desired layout of touchscreens, audio converter, and input/output ports. The modules may include a geometry which provides a flush-mounting between the housing and the modules. The flush-mounting may prevent a passenger from accessing the cavity defined by the housing. The audio converter includes a digital-to-analog converter and an audio jack. The digital-to-analog converter converts an uncompressed digital audio signal to an analog audio signal. The audio jack receives a stereo analog signal and outputs the stereo analog signal to an audio plug.

14 Claims, 8 Drawing Sheets

(56) References Cited

U.S. PATENT DOCUMENTS

| | | |
|---|---|---|
| 8,610,549 B2 | 12/2013 | Modarres et al. |
| 9,317,146 B1 | 4/2016 | Hufnagel |
| 9,654,103 B2 | 5/2017 | Buttolo et al. |
| 9,690,380 B2 | 6/2017 | Monkhouse et al. |
| 9,742,898 B2 | 8/2017 | Hockenberry et al. |
| 9,841,452 B2 * | 12/2017 | Oh ................... H04M 1/0274 |
| 10,068,728 B2 | 9/2018 | Huska et al. |
| 10,168,782 B1 | 1/2019 | Tchon et al. |
| 10,423,228 B2 | 9/2019 | Cherif et al. |
| 11,281,295 B2 | 3/2022 | Yee et al. |
| 11,365,007 B2 | 6/2022 | Wu |
| 11,455,039 B2 | 9/2022 | Heyd et al. |
| 2003/0184574 A1 | 10/2003 | Phillips et al. |
| 2003/0208764 A1 | 11/2003 | Galipeau et al. |
| 2003/0233658 A1 | 12/2003 | Keen et al. |
| 2006/0142002 A1 | 6/2006 | Funderburk et al. |
| 2006/0209037 A1 | 9/2006 | Wang et al. |
| 2007/0213009 A1 * | 9/2007 | Higashida .......... H04B 7/18508 455/3.06 |
| 2008/0112573 A1 * | 5/2008 | Huang ................ H04R 27/00 381/86 |
| 2009/0007193 A1 * | 1/2009 | Correa .............. H04N 21/4341 725/76 |
| 2012/0206248 A1 | 8/2012 | Biggs |
| 2013/0207793 A1 | 8/2013 | Weaber et al. |
| 2013/0288649 A1 * | 10/2013 | Dave ................. H04M 1/72457 455/414.1 |
| 2014/0003616 A1 * | 1/2014 | Johnson ............. H04R 29/001 381/74 |
| 2014/0132528 A1 | 5/2014 | Catton |
| 2014/0241535 A1 * | 8/2014 | Poulsen ................. H04R 5/04 381/58 |
| 2015/0208155 A1 * | 7/2015 | Turner ................ H04R 29/00 381/58 |
| 2016/0195931 A1 | 7/2016 | Czelnik et al. |
| 2017/0270113 A1 | 9/2017 | Ebeling et al. |
| 2018/0004294 A1 | 1/2018 | Eraslan et al. |
| 2018/0074591 A1 | 3/2018 | Modarres et al. |
| 2018/0167081 A1 * | 6/2018 | Stuart ................ H03M 1/0639 |
| 2018/0281990 A1 | 10/2018 | Fagan et al. |
| 2019/0052992 A1 * | 2/2019 | MacLellan ............... H04S 7/305 |
| 2019/0138153 A1 | 5/2019 | Olley et al. |
| 2019/0346926 A1 | 11/2019 | Kirisken et al. |
| 2021/0129672 A1 | 5/2021 | Ahn et al. |
| 2021/0362874 A1 | 11/2021 | Gunaratnage et al. |
| 2021/0376883 A1 * | 12/2021 | Harper ............. B64D 11/00155 |
| 2022/0001985 A1 | 1/2022 | Bathla et al. |
| 2022/0055751 A1 * | 2/2022 | Hansson ........... B64D 11/0624 |
| 2022/0083139 A1 | 3/2022 | Heyd et al. |

FOREIGN PATENT DOCUMENTS

| | | |
|---|---|---|
| CN | 104681074 A * | 6/2015 |
| EP | 0185143 A1 * | 6/1986 |
| EP | 2817684 A4 | 11/2015 |
| EP | 2421755 B1 | 10/2018 |
| EP | 3230829 B1 | 10/2019 |
| EP | 3296205 B1 | 3/2022 |
| GB | 2583946 A | 11/2020 |
| WO | 2022165595 A1 | 8/2022 |

* cited by examiner

DYNAMIC CABIN DIGITAL HEADPHONE JACK

CROSS-REFERENCE TO RELATED APPLICATION

The present applications claims the benefit under 35 U.S.C. § 119(e) of U.S. Provisional Application Ser. No. 63/255,476, filed Oct. 14, 2021, U.S. Provisional Application Ser. No. 63/255,552, filed Oct. 14, 2021, and U.S. Provisional Application Ser. No. 63/255,515, filed Oct. 14, 2021, which are each incorporated herein by reference in the entirety.

TECHNICAL FIELD

The present invention generally relates to signal processing, and more specifically to digital audio signal processing within an aircraft cabin.

BACKGROUND

Analog headphone signals may be run throughout the cabin. The analog headphone signals may be subject to interference and noise due to electromagnetic interference. Furthermore, the signals may be transmitted over wiring which may be costly and have a given weight. Therefore, it would be advantageous to provide a device, system, and method that cures the shortcomings described above.

SUMMARY

An audio converter is described, in accordance with one or more embodiments of the present disclosure. In some embodiments, the audio converter includes a network interface comprising a first ethernet port configured to receive a plurality of packets. In some embodiments, the audio converter includes one or more processors coupled to the network interface. In some embodiments, the one or more processors are configured to execute program instructions maintained on a memory medium causing the one or more processors to assemble the plurality of packets into a digital audio signal. In some embodiments, the audio converter includes a digital-to-analog converter coupled to the one or more processors. In some embodiments, the digital-to-analog converter is configured to receive the digital audio signal and convert the digital audio signal to an analog audio signal. In some embodiments, the audio converter includes a power amplifier coupled to the digital-to-analog converter. In some embodiments, the power amplifier is configured to receive the analog audio signal from the digital-to-analog converter, amplify the analog audio signal, and split the analog audio signal into a stereo analog audio. In some embodiments, the audio converter includes an audio jack coupled to the power amplifier and configured to couple to an audio plug. In some embodiments, the audio jack is configured to receive the stereo analog audio from the power amplifier and output the stereo analog audio to the audio plug.

A system is described, in accordance with one or more embodiments of the present disclosure. In some embodiments, the system includes a network. In some embodiments, the system includes one or more cabin controllers configured to send a plurality of packets over the network. In some embodiments, the system includes a plurality of assemblies. In some embodiments, the plurality of assemblies each comprise a housing. In some embodiments, the plurality of assemblies each comprise an audio converter. In some embodiments, the audio converter includes a network interface comprising a first ethernet port configured to receive the plurality of packets from the network. In some embodiments, the audio converter includes one or more processors coupled to the network interface. In some embodiments, the one or more processors are configured to execute program instructions maintained on a memory medium causing the one or more processors to assemble the plurality of packets into a digital audio signal. In some embodiments, the audio converter includes a digital-to-analog converter coupled to the one or more processors. In some embodiments, the digital-to-analog converter is configured to receive the digital audio signal and convert the digital audio signal to an analog audio signal. In some embodiments, the audio converter includes a power amplifier coupled to the digital-to-analog converter. In some embodiments, the power amplifier is configured to receive the analog audio signal from the digital-to-analog converter, amplify the analog audio signal, and split the analog audio signal into a stereo analog audio. In some embodiments, the audio converter includes an audio jack coupled to the power amplifier and configured to couple to an audio plug. In some embodiments, the audio jack is configured to receive the stereo analog audio from the power amplifier and output the stereo analog audio to the audio plug.

BRIEF DESCRIPTION OF THE DRAWINGS

Implementations of the concepts disclosed herein may be better understood when consideration is given to the following detailed description thereof. Such description makes reference to the included drawings, which are not necessarily to scale, and in which some features may be exaggerated and some features may be omitted or may be represented schematically in the interest of clarity. Like reference numerals in the drawings may represent and refer to the same or similar element, feature, or function. In the drawings.

DETAILED DESCRIPTION

Figure 1:
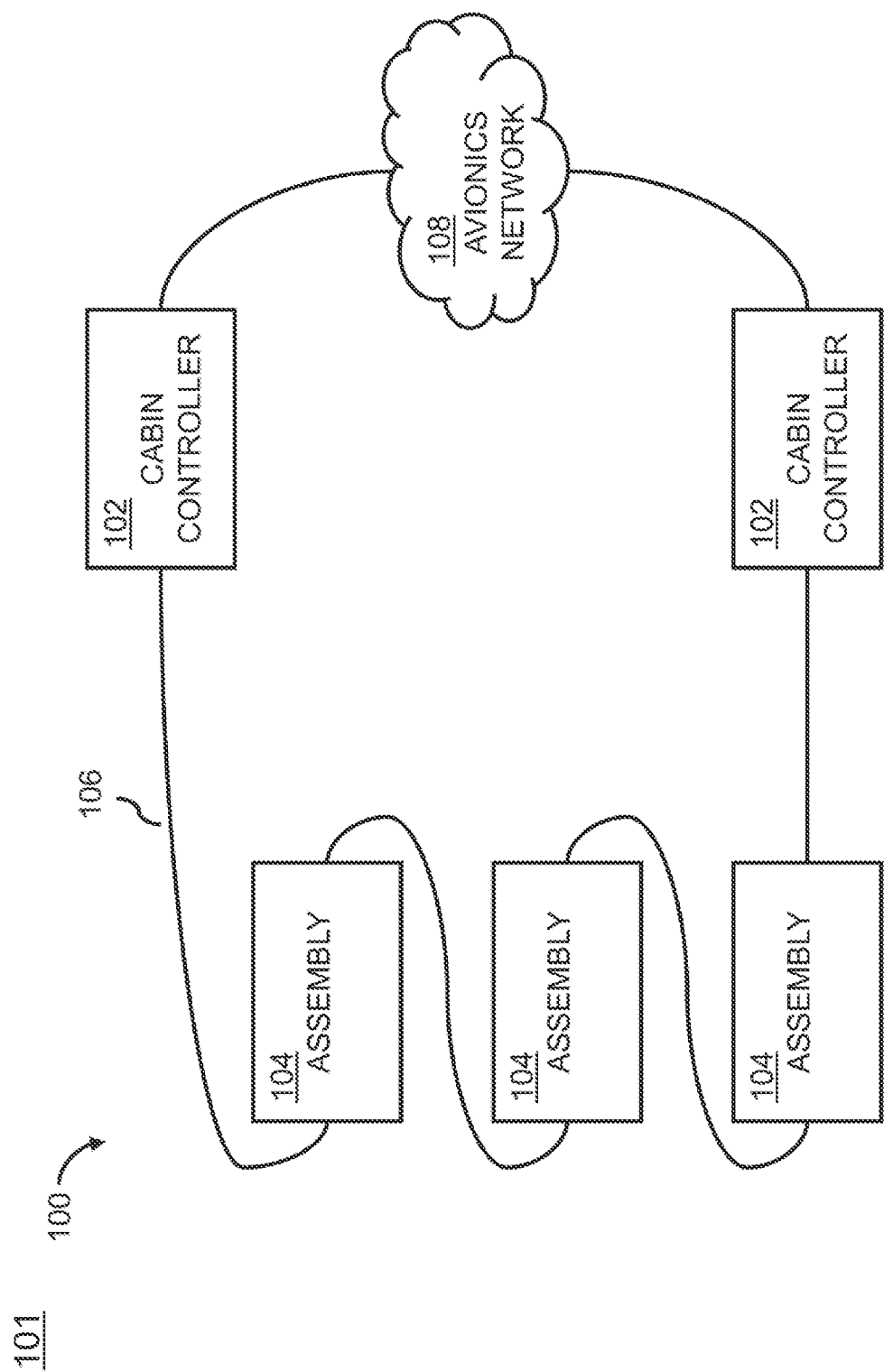
FIG. 1 depicts a simplified block diagram of a system within a cabin of an aircraft, in accordance with one or more embodiments of the present disclosure.
Figure 2A:
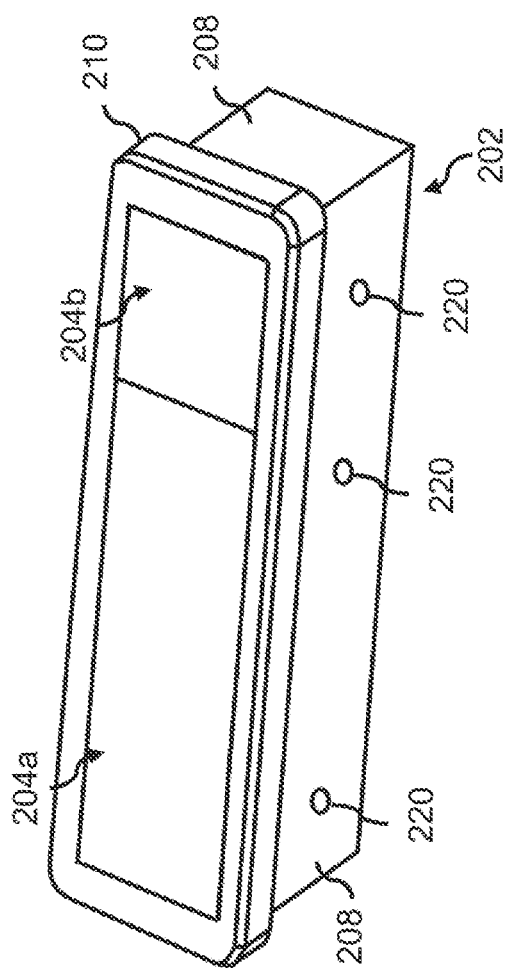
FIG. 2A depicts a perspective view of an assembly including a module within a housing, in accordance with one or more embodiments of the present disclosure.
Figure 2B:
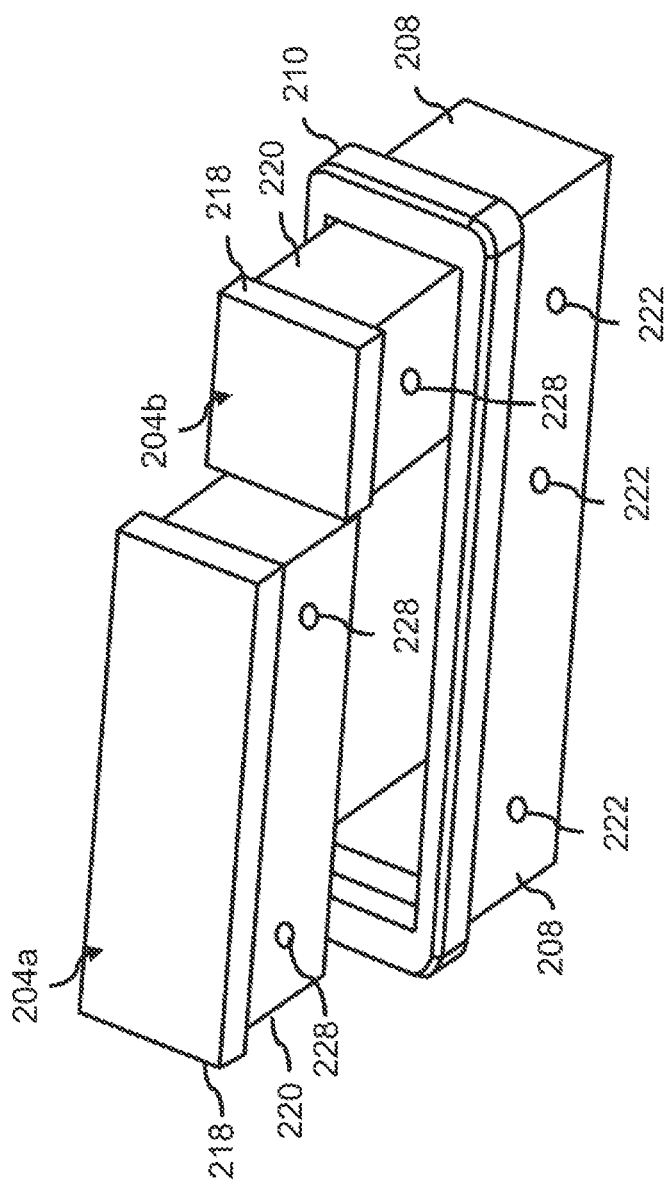
FIG. 2B depicts an exploded view of an assembly including a module, in accordance with one or more embodiments of the present disclosure.
Figure 2C:
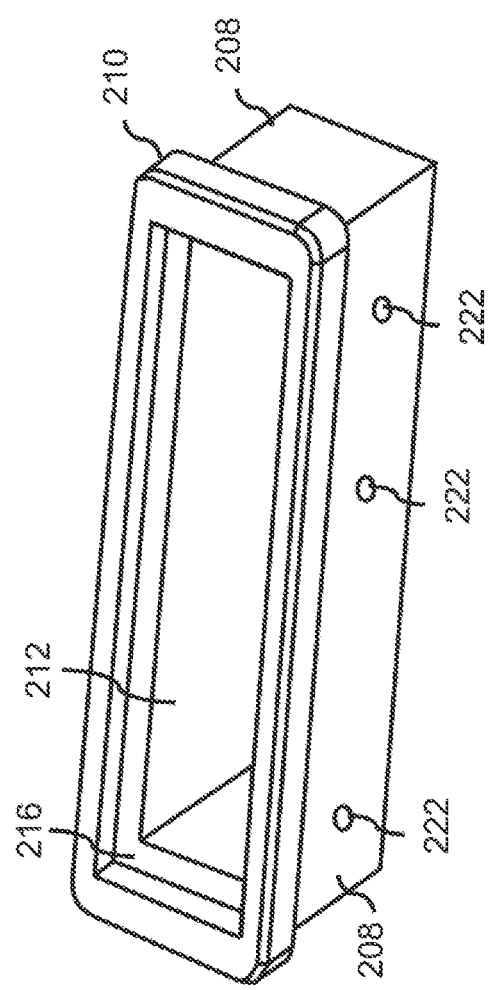
FIG. 2C depicts a perspective view of a housing of an assembly, in accordance with one or more embodiments of the present disclosure.
Figure 2D:
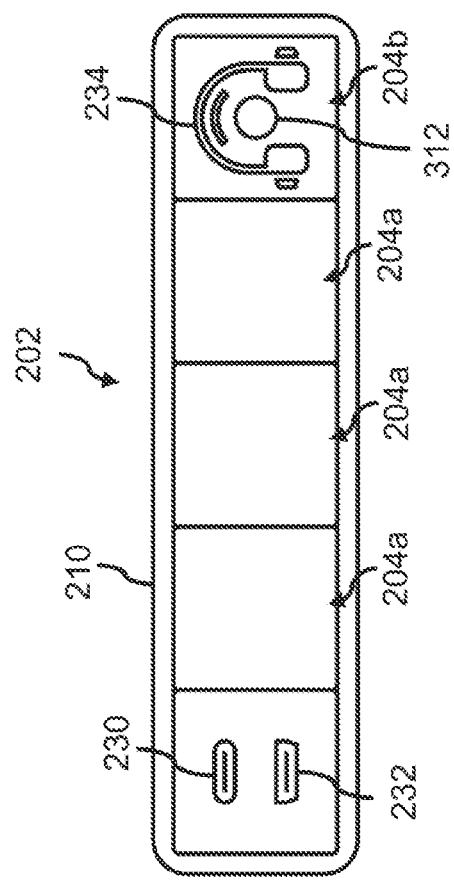
FIG. 2D depicts a front view of an assembly including a module, in accordance with one or more embodiments of the present disclosure.
Figure 2E:
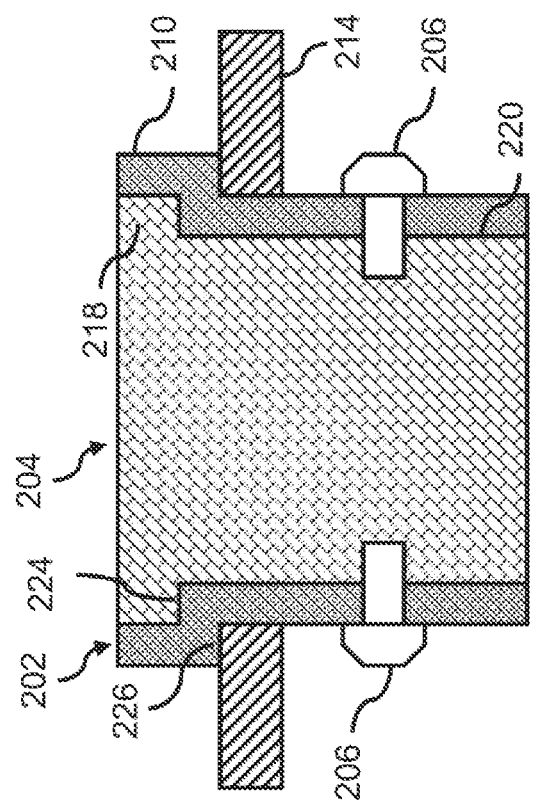
FIG. 2E depicts a cross-section of an assembly including a housing and a module where the housing is coupled to a support structure in a cabin of an aircraft, in accordance with one or more embodiments of the present disclosure.
Figure 2F:
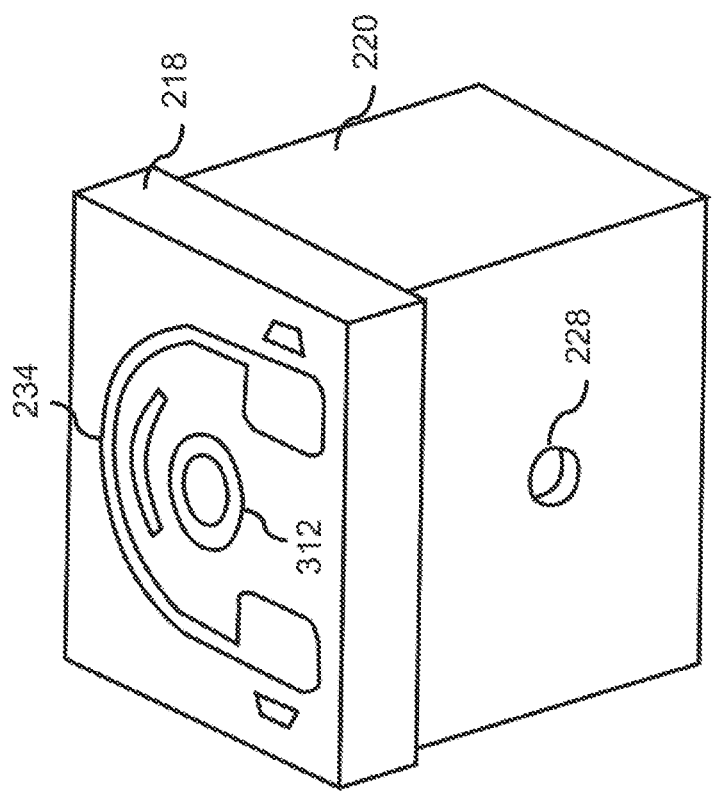
FIG. 2F depicts a perspective view of an audio converter module, in accordance with one or more embodiments of the present disclosure.

Before explaining one or more embodiments of the disclosure in detail, it is to be understood that the embodiments are not limited in their application to the details of construction and the arrangement of the components or steps or methodologies set forth in the following description or illustrated in the drawings. In the following detailed description of embodiments, numerous specific details are set forth in order to provide a more thorough understanding of the disclosure. However, it will be apparent to one of ordinary skill in the art having the benefit of the instant disclosure that the embodiments disclosed herein may be practiced without some of these specific details. In other instances, well-known features may not be described in detail to avoid unnecessarily complicating the instant disclosure.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only and should not be construed to limit the disclosure in any way unless expressly stated to the contrary.

Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of "a" or "an" may be employed to describe elements and components of embodiments disclosed herein. This is done merely for convenience and "a" and "an" are intended to include "one" or "at least one," and the singular also includes the plural unless it is obvious that it is meant otherwise.

Finally, as used herein any reference to "one embodiment" or "some embodiments" means that a particular element, feature, structure, or characteristic described in connection with the embodiment is included in at least one embodiment disclosed herein. The appearances of the phrase "in some embodiments" in various places in the specification are not necessarily all referring to the same embodiment, and embodiments may include one or more of the features expressly described or inherently present herein, or any combination or sub-combination of two or more such features, along with any other features which may not necessarily be expressly described or inherently present in the instant disclosure.

Haptic feedback is generally discussed in U.S. Pat. No. 9,317,146, entitled "Haptic touch feedback displays having double bezel design," issued on Apr. 19, 2016, and U.S. patent application Ser. No. 17/965,465, entitled "DYNAMIC AND CONTEXT AWARE CABIN TOUCHSCREEN CONTROL MODULE," filed on Oct. 13, 2022, which are both incorporated herein by reference in the entirety.

Reference will now be made in detail to the subject matter disclosed, which is illustrated in the accompanying drawings. Embodiments of the present disclosure are generally directed to headphone jacks. The headphone jacks may be housed in an audio converter. The audio converter may receive a digital signal from an ethernet network and generate an analog output to the headphone jacks. The audio converter may be housed within a housing which is dimensioned to fit within one or more cavities in an aircraft cabin.

Referring now to FIG. 1, a system 100 is described, in accordance with one or more embodiments of the present disclosure. In embodiments, the system 100 may be located within a cabin 101 of an aircraft. The system 100 may also be referred to as an in-flight entertainment system. The system 100 may include one or more components, such as, but not limited to, cabin controllers 102, assemblies 104, a network 106, avionics network 108, and the like.

The cabin controller 102 may provide input/output (I/O) connectivity to the network 106. The cabin controller 102 may include one or more Ethernet ports. The Ethernet ports may include any format of Ethernet, such as, but not limited to, 100-BaseTX Ethernet Ports, ARINC 854 100-BaseT1 single pair Ethernet ports, and the like. For example, the cabin controller 102 may include two of the 100-BaseTX Ethernet Ports and two of the ARINC 854 100-BaseT1 single pair Ethernet ports. In embodiments, the cabin controller 102 may include an ethernet switch. The ethernet switch may couple the cabin controller 102 to the network 106. In embodiments, the Ethernet switch may transition between ARINC 854 single pair Ethernet and 100BaseTX Ethernet. The ability to transition between ARINC 854 single pair Ethernet and 100BaseTX Ethernet may allow the cabin controller 102 to be coupled between multiple types of Ethernet connections within the cabin 101 of the aircraft. In embodiments, the cabin controller 102 may be a network switch between the network 106 and the avionics network 108. For example, the network 106 may be configured according to ARINC 854 single pair Ethernet and the avionics network may be configured according to 100BaseTX Ethernet, although this is not intended to be limiting.

In embodiments, the cabin controller 102 is configured to implement one or more network protocols for communicating digital data to the assemblies 104 by way of the network 106. For example, the cabin controller 102 may implement Internet Protocol (IP) to send the digital audio data to the assemblies by way of the network 106. Each of the assemblies 104 on the network 106 may have at least one IP address that uniquely identifies the assembly from all of the other devices on the network 106. Using IP, a message is divided into small chunks called packets that each contain both the sender's IP address and the receiver's IP address. Each packet is treated as an independent unit of data without any relation to any other unit of data. The IP layer handles communication from between the devices on the network 106 by providing, for example, the routing information that includes the IP addresses. Because a message is divided into a number of independent packets, each packet can, if necessary, be sent by a different route between the sending device and the receiving device. As a result, packets can arrive in a different order than the order in which they were sent. The packets may be transmitted according to a communication protocol. The communication protocol may include any suitable communication protocol, such as, but not limited to, Transmission Control Protocol/Internet Protocol (TCP/IP) or a User Datagram Protocol (UDP). In embodiments, the communication protocol may be UDP.

In embodiments, the cabin controller 102 may utilize the network protocols for communicating digital audio data. The digital audio data may include, but is not limited to, uncompressed digital audio data. The uncompressed digital audio data may be transmitted with any uncompressed audio format, such as, but not limited to, WAF, AIFF, AU, or PCM. In embodiments, the format of the uncompressed digital audio data comprises linear pulse code modulation (LPCM). As may be understood, the digital audio data may include any audio, such as, but not limited to, music, passenger announcements, security briefings, video player, HDMI source, and the like. Delivering the audio content in the form of the digital audio may be advantageous in maintaining the signal quality of the audio. For example, the signal quality may be maintained over long cable runs throughout the cabin 101.

The network 106 may also be referred to as a cabin equipment network or an ethernet network. The network 106 may be configured according to any protocol, such as, but not limited to, ARINC 854, IEEE 802.3, and the like. The network 106 may connect the cabin controllers 102 and/or the assemblies 104. The network 106 may connect the cabin controllers 102 and/or the assemblies 104 in any network topology. In embodiments, the network 106 may include a daisy-chain network topology. A daisy-chain network topology may refer to connecting multiple of the assemblies 104 in series. The daisy-chain network topology may allow the cabin controller 102 to communicate with each of the assemblies 104 while only using one port of the cabin controller 102. The daisy chain network topology may be particularly advantageous in the context of in-flight entertainment systems. The in-flight entertainment system may include several hundred or more devices which may each include a unique IP address. The cabin controller 102 may communicate to each of the assemblies 104 in the network 106 using only one port. In embodiments, each of the assemblies 104 may be connected in series ("daisy-chained") using ARINC 854 single-pair Ethernet (SPE).

The avionics network 108 may include various components which are not depicted herein, such as a central processing server. The central processing server may send digital audio signals to the cabin controller 102 by way the avionics network 108. The avionics network 108 may comply with various standards or protocols, such as, but not limited to, Aeronautical Radio Inc. (ARINC) standard 664, Ethernet protocols, or User Datagram Protocol (UDP).

In embodiments, the system 100 includes an aircraft power supply (not depicted). The aircraft power supply may be configured to power one or more components of the system 100. The aircraft power supply may include any suitable power supply known in the art. In this regard, any distributed or local power supply that provides conditioned power suitable for implementation in the context of avionics (e.g., nominal power 28 VDC, 20.5 VDC to 32.2 VDC). Any of the cabin controllers 102, assemblies 104, a network 106, and/or the avionics network 108 may receive power from the aircraft power supply for executing any of the various functions described further herein.

Referring now to FIGS. 2A-2F, the assembly 104 is described, in accordance with one or more embodiments of the present disclosure. In embodiments, the assembly 104 may include one or more components. For example, the assembly 104 may include a housing 202, one or more modules 204, fasteners 206, and the like.

The housing 202 may be configured to house one or more of the modules 204. The housing 202 may also be referred to as a container, shell, a box, and the like. The housing 202 may include walls 208. The walls 208 may define a rectangular box having an open side. Thus, the housing 202 may form a rectangular box having an open side. In embodiments, the walls 208 may also define the opening in the side of the rectangular box and a cavity 212.

In embodiments, the cavity 212 may be dimensioned to receive one or more of the modules 204. For example, the cavity 212 may receive a cubic portion 220 of one or more of the modules 204. The assembly 104 may include any number of the modules 204 within the cavity 212 of the housing 202. The modules 204 may be combined in a number of side-by-side arrangements within the cavity 212. In this regard the modules 204 may be considered modular.

For example, modules 204 of differing width may be added or removed from the housing 202 to fill up the cavity 212. The modularity of the modules 204 may be advantageous in allowing the modules 204 to be rearranged to achieve a different functionality. Additionally, the modules 204 may be arranged based on a layout of the cabin 101. The modules 204 may be configured to be detached and removed from the housing 202. A second of the modules 204 may then be inserted into and attached to the housing 202. Thus, the modules 204 may be swapped for another module 204. The assembly 104 may include one or more configurations of the modules 204 within the housing 202. In embodiments, the assembly 104 may include any number of the modules 204 in a side-by-side configuration, such as, but not limited to, a one-by-one configuration, a one-by-two configuration, one-by-three configuration, and the like.

The housing 202 may include a bezel 210. The bezel 210 may be coupled to the walls 208. In embodiments, the bezel 210 may be wider and longer than the box defined by the walls 208. In embodiments, the bezel 210 may define a cavity 216. The cavity 212 and the cavity 216 may be considered joined together. The cavity 216 may provide access to the cavity 212 defined by the walls 208. The cavity 216 may be a rectangular cavity. In embodiments, the cavity 216 may be configured to receive the module 204. For example, the cavity 216 may be configured to receive a cubic portion 218 of the module 204. In embodiments, the cavity 212 may be dimensioned to receive the rear portion 220 of the module 204.

The module 204 may include a cubic portion 220. The cubic portion 220 may also be referred to as a rear portion of the module 204. The cubic portion 220 may be received within the cavity 212 defined by the walls 208 of the housing.

The module 204 may include a cubic portion 218. The cubic portion 218 may be coupled to the cubic portion 220. The cubic portion 218 may not be received within the cavity 212 defined by walls 208 when the rear portion 220 is received within the cavity 212. In this regard, the cubic portion 220 may shield or cover the cavity 212.

In embodiments, the cubic portion 218 may be wider and longer than the cubic portion 220. In this regard, the cubic portion 218 may include a face 224b extending from the cubic portion 220. In embodiments, the cubic portion 218 and the cubic portion 220 are concentric. As used herein, concentric may refer to a center-point of the rectangular cross-section of the cubic portion 218 and a center-point of the rectangular cross-section of the cubic portion 220 being concentric. In embodiments, the cubic portion 218 may be referred to as a bezel portion. The face 224a of the cubic portion 218 may extend around the perimeter of the cubic portion 220 such that the cubic portion 218 is configured as a bezel portion for the cubic portion 220. The cubic portion 218 of the module 204 may include a face 224a abutting to a face 224b of the wall 208 when the module 204 is received within the cavity 212. The face 224a may be disposed around the perimeter of the module 204. Similarly, the face 224b may be disposed around the perimeter of the walls 208 (e.g., the rectangular box). The face 224a and the face 224b may generally be oriented perpendicular to the direction in which the module 204 is inserted into the cavity 212. The abutment between the face 224a and the face 224b may prevent the module 204 from being inserted further into the cavity 212. In this regard, the cubic portion 218 may shield or cover the cavity 216 defined the bezel 210 of the housing 202. The face 224a and the face 224b may also be referred to as a ledge.

In embodiments, the cubic portion 218 may be received within the cavity 216 defined by the bezel 210. The bezel 210 and the cubic portion 218 may form a flush surface when the cubic portion 218 is received within the cavity 216 defined by the bezel 210. A flush surface may refer to when the front of the bezel 210 and the front of the cubic portion 218 are substantially level or form an unbroken surface (see FIG. 2A, FIG. 2E for example). Providing the flush surface between the modules 204 and the housing 202 may be advantageous to improve a comfort level of a passenger interacting with the modules 204. For example, a passenger may not notice the interface between the housing 202 and the module 204 when running a finger along the module 204 when the housing 202 and the module 204 are flush. Similarly, multiple of the modules 204 may be considered to form a flush surface with the housing 202. The passenger may then be unable to determine the interface between the modules 204. Thus, the module 204 may be flush-mounted to the housing 202.

In embodiments, the walls 208 of the housing 202 may define one or more openings 222. The openings 222 may be configured to receive one of the fasteners 206. In embodiments, the cubic portion 220 of the module 204 may include one or more threaded inserts 228. The threaded inserts 228 may be coupled to a side of the cubic portion 220. The modules 204 may be inserted within the cavities of the housing 202. The fasteners 206 may then be used to fasten the modules 204 to the housing 202. The fasteners may be attached to the module 204 through the openings 222 to the threaded inserts 228, thereby fastening the module 204 to the housing 202. For example, the rear portion 220 of the module 204 may be fastened to the housing 202 by the fasteners 206. Thus, the modules may be assembled with the housing in a two-step process which may be advantageous for providing ease-of-assembly. The fasteners 206 may include any suitable type of fastener for fastening the module 204 to the walls 208 of the housing 202, such as, but not limited to, bolts, rivets, and the like.

In embodiments, the housing 202 may be configured to secure the one or more modules 204 to a support structure 214 (see FIG. 2E) within the cabin 101. For example, the support structure 214 may be any structure within the cabin 101 which is configured to support the housing 202, such as, but not limited to, a seat back, an arm rest, a partition, a monument, an ottoman, and the like. The support structure 214 may define a cavity. The cavity defined by the support structure 214 may generally be a rectangular cavity. A portion of the housing 202 may be received within the cavity. In embodiments, the box defined by the walls 208 may be received within the cavity defined by the support structure 214 of the cabin 101. The bezel 210 may not be received within the cavity defined by the support structure 214 of the cabin 101 when the box defined by the walls 208 is received within the cavity. The bezel 210 may include a face 226 abutting to the exterior of the support structure 214 when the housing 202 is received within the cavity defined by the support structure 214. The face 226 may be disposed around the perimeter of the housing 202. The face 226 of the bezel 210 may be perpendicular to the direction in which the housing 202 is inserted into the cavity defined by the support structure 214. The abutment between the face 226 and the support structure 214 may prevent the housing 202 from being inserted further into the cavity. In this regard, the bezel 210 may shield or cover the cavity defined by the support structure 214 of the cabin 101. As may be understood, the dimensions of the walls 208 and the bezel 210 are not intended to be limiting. The walls 208 and the bezel 210 may be dimensioned based on the cavity defined by the support structure 214, such that the walls 208 are received within the cavity of the support structure 214 and the bezel 210 covers the cavity of the support structure 214. Thus, the housing 202 may be surface-mounted to the support structure 214. Additionally, the housing 202 may be customized for the installation. For example, the dimensions of the housing 202 may be adjusted to allow the assembly 104 to be mounted in different sized cavities of the support structure 214 to fill the cavity.

The module 204 may refer to one or more electronic assemblies. The modules 204 may communicate with each other by way of the network 106. In embodiments, the modules 204 may receive power from an aircraft power supply. In embodiments, the modules may be coupled to the network 106.

The module 204 may include, but is not limited to, a touch panel 204a, USB ports 230, HDMI ports 232, and/or an audio converter 204b. The audio jack may be housed in an audio converter module as will be described further herein. In embodiments, the assembly 104 includes at least one touch panel 204a and at least one audio converters 204b in the housing 202. Although the modules 204 are described as including the touch panel 204a, the audio converter 204b, the USB ports 230, and/or the HDMI ports 232, this is not intended as a limitation of the present disclosure. It is further contemplated that the assembly 104 of the system 100 may include a variety of modules. It is contemplated the modules 204 may include a Bluetooth transceiver, an audio input port, a video encoder, and the like.

In embodiments, the module 204 may include a touch panel 204a. The touch panel 204a may also be referred to as a touchscreen module, a touchscreen display, a haptic touchscreen display, an OLED touch panels, and the like. The touch panel 204a may include an organic light-emitting diode (OLED) display. The OLED display may operate with a range of colors in the visible spectrum. In embodiments, the OLED displays may be configured to receive a user input, such as, by the touch panel 204a.

In embodiments, the touch panel 204a may include haptic feedback. The haptic feedback may be responsive to user inputs on the touch panel 204a. In embodiments, the touch panel 204a may include haptic feedback to simulate the physical feel of a button.

The touch panel 204a may include one or more functionalities. The touch panel 204a may implement one or more functions when touched. For example, the function may include, but is not limited to, a call flight attendant function, a music function, an overhead light function, an order drink function, a request pillow function, a settings function, a multimedia function, a volume function, a language function, and the like. In this regard, the tough panel 204a may replace the functionality of physical switches with a touchscreen display. The touch panel 204a may display an image representative of the function associated with the touch panel 204a.

In embodiments, the touch panel 204a may include dynamic user interfaces. The touch panel 204a may be customizable by adjusting the content displayed on the display. In this regard, the image on the touch panel 204a may change based on the current function. The functions may be software controlled. The functions may allow cabin controls to be dynamically changed with a software configuration update. The software configuration update may be provided to the tough panel 204a. The touch panel 204a may include a dynamic function re-allocation. The dynamic function re-allocation may be used to re-allocate one or more functions of the touch panel dynamically. As used herein, dynamically may refer to in-real time, such as during flight. The dynamic function re-allocation may be used to re-allocate buttons displayed by the touch panel 204a. For example, the buttons may include a font color, background color, language, symbology, and the like. The font color, background color, language, and symbology may be changes based upon a setting. The setting may be updated by a user input on the touch panel 204a. Thus, the touch panel 204a may be adjusted to meet the preferences of the passenger interacting with the touch panel 204a.

In embodiments, the switch functionality of the touch panel 204a is managed by a software configuration of the cabin controller 102. Managing the switch functionality by the software configuration of the cabin controller 102 may be advantageous to support replacement touch panels. In this regard, the touch panel 204a may be detached and removed from the housing 202. A replacement touch panel may then be inserted into and attached to the housing 202. The replacement touch panel may then load the switch functionality from the software configuration. Thus, each of the touch panels in the cabin 101 may include uniform functionality. The uniform functionality may be advantageous to prevent outdated software in the touch panels from impairing switch functionality.

In embodiments, the module 204 may include a USB port 230. The USB port 230 may include any USB port, such as, but not limited to, USB-C. In embodiments, the USB-C may be configured to deliver power, such that the USB-C may be considered USB-C power delivery ports. For example, the cabin controller 102 may include one or more of the USB-C power delivery ports (e.g., (2) USB-C power delivery ports). In embodiments, the module 204 may include an HDMI port 232. The HDMI port 232 may include, but is not limited to, an HDMI 2.1 port. The USB port 230 and/or the HDMI port 232 may be advantageous to provide connectivity between a user equipment (e.g., a cell phone, tablet, computer, etc.) and the system 100. The USB port 230 and/or the HDMI port 232 may provide input and/or output. For example, the USB port 230 and/or the HDMI port 232 may provide an input to a bulkhead monitor. The input may include receiving a video signal from a laptop and display the video on the bulkhead monitor.

Embodiments of the present disclosure are also directed to the modules 204 being an audio converter 204b. The audio converter 204b may also be referred to as a digital headphone jack. The audio converter 204b may receive uncompressed digital audio and convert the digital audio to analog audio. For example, the uncompressed digital audio may be a LCPM digital. For instance, the LPCM digital audio may be 48 kHz 16-bit LPCM digital audio, although this is not intended to be limiting. In embodiments, the audio converter 204b includes a frequency response of 20 Hz to 20 kHz +/−3 dB.

In embodiments, the audio converter 204b may include a backlit headphone icon 234. The backlit headphone icon 234 may include a color. In embodiments, the color may be configurable. The color of the backlit headphone icon 234 may be preconfigured from the cabin controller 102. For example, the cabin controller 102 may preconfigure the color of the backlit headphone icon 234 based on a color-scheme or motif within the cabin 101. In embodiments, the cabin controller 102 may be configured to adjust the brightness and/or the color of the backlight headphone icon 234. The cabin controller 102 may adjust the brightness and/or the color of the backlight headphone icon 234 in real time. For example, the cabin controller 102 may increase the brightness based on the time of day.

Figure 3:
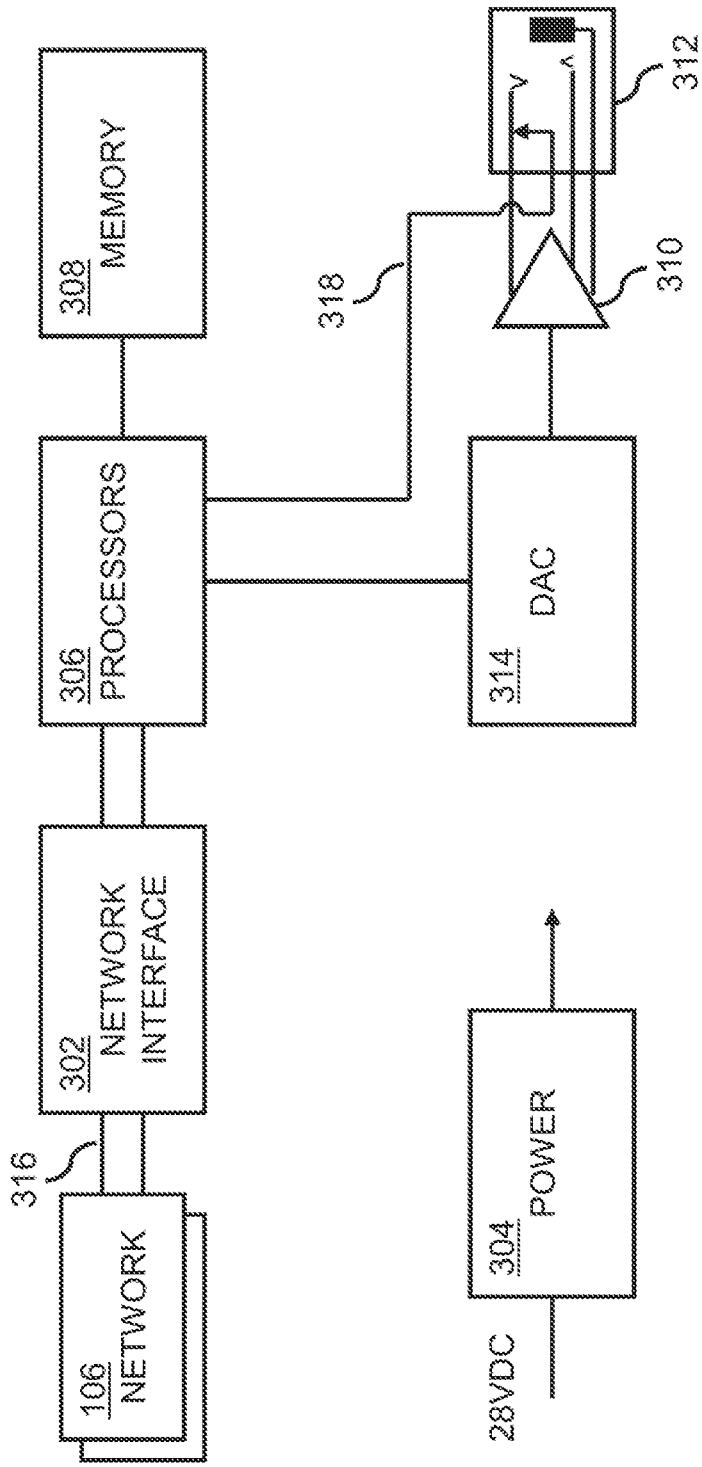
FIG. 3 depicts a circuit diagram of an audio converter module, in accordance with one or more embodiments of the present disclosure.

Referring now to FIG. 3, a circuit diagram 300 of the audio converter 204b is described, in accordance with one or more embodiments of the present disclosure. In embodiments, the audio converter 204b may include one or more of a network interface 302, power supply 304, processors 306, memory 308, amplifier 310, audio jack 312, digital-to-analog converter 314 (DAC or D/A), and the like.

The network interface 302 may include one or more ethernet ports 316. The audio converter 204b may receive the packets from the network 106. For example, the ethernet ports 316 may be configured to receive the packets from the network 106. The packets may be transmitted according to a communication protocol. The packets may include, but are not limited to, packets transmitted according to a communication protocol (e.g., transmission control protocol/internet protocol (TCP/IP), user datagram protocol (UDP)). The ethernet ports 316 may also be configured to forward the packets to the network 106. For example, the network interface 302 may include a first ethernet port and a second ethernet port. The first ethernet port and the second ethernet port may couple to separate lines of the network 106 for daisy-chaining the audio converter 204b to the network 106. In embodiments, the audio converter 204b may receive the digital audio signal from the network 106 by way of Ethernet twisted pair or fiber optic link coupled to the Ethernet port. For example, the Ethernet port may be a TJA1102 (8×8) dual port Ethernet Physical Layer (PHY) configured to receive data from dual twisted pair cables, said twisted pair cables transmitting according to 100Base-T1 standards. In embodiments, the network interface 302 is disposed in the cubic portion 220 of the audio converter 204b. For example, the network interface 302 may be disposed in a rear surface of the cubic portion 220.

The power supply 304 may include any power supply known in the art, such as, but not limited to a local power supply that provides conditioned power suitable for implementation in the context of avionics (e.g., 28 VDC) capable of meeting the requirements of the audio converter 204b.

The one or more processors 306 may be coupled to the network interface 302. The one or more processors 306 may include any processors known in the art. Those skilled in the art will recognize that aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software/and or firmware would be well within the skill of one skilled in the art in light of this disclosure. Such hardware, software, and/or firmware implementation may be a design choice based on various cost, efficiency, or other metrics. In this sense, the embedded micro-processor may include any microprocessor-type device configured to execute software algorithms and/or instructions. In general, the term "processor" may be broadly defined to encompass any device having one or more processing elements, which execute program instructions from memory, from firmware, or by hardware implemented functions. It should be recognized that the steps described throughout the present disclosure may be carried out by the processors. For example, the one or more processors 306 may include, but are not limited to, an iMX-RT series processor.

The memory 308 may include any storage medium known in the art. For example, the storage medium may include a non-transitory memory medium. For instance, the non-transitory memory medium may include, but is not limited to, a read-only memory (ROM), a random-access memory (RAM), a magnetic or optical memory device (e.g., disk), a solid-state drive and the like. For example, the memory 308 may include flash memory (e.g., NOR flash memory). It is further noted that memory may be housed in a common controller housing with the one or more processor(s). For example, the memory and the processor may be housed in a processing unit, or the like. In an alternative embodiment, the memory may be located remotely with respect to the physical location of the one or more processors. In another embodiment, the memory maintains program instructions for causing the processor(s) to carry out the various steps described through the present disclosure.

The one or more processors 306 may process the ethernet packets. The one or more processors may receive the ethernet packets. The ethernet packets may be UDP real-time audio messages. The one or more processors 306 may be configured to execute program instructions maintained on a memory medium (e.g., the memory 308). The program instructions may cause the one or more processors to assemble the plurality of packets into a digital audio signal. For example, the program instructions may cause the one or more processors to execute a communication protocol for assembling the plurality of packets into a digital audio signal. The communication protocol may include transmission control protocol/internet protocol (TCP/IP), user datagram protocol (UDP), and the like. The communication protocol may include removing the packet headers. The one or more processors 306 may pass the packets to an application layer in the order in which the packets are received. In embodiments, the packets may contain a digital audio signal. The ordered packets may then be reassembled into the digital audio signal. The program instructions may then cause the one or more processors to transmit the digital audio signal which is assembled from the packets to the digital-to-analog converter 314.

The digital-to-analog converter 314 may be coupled to the one or more processors 306. The digital-to-analog converter 314 may receive the digital audio signal from the one or more processors 306. The digital-to-analog converter 314 may then convert the digital audio signal to an analog audio signal. For example, the digital audio signal may include a linear pulse code modulation (LPCM) digital audio signal. The digital-to-analog converter 314 may convert the linear pulse code modulation (LCPM) digital audio signal to the analog audio signal. The conversion from the linear pulse code modulation (LCPM) digital audio signal to the analog audio signal may occur by any suitable process.

The power amplifier 310 may be coupled to the digital-to-analog converter 314. The power amplifier 310 may receive the analog audio signal from the digital-to-analog converter 314. The power amplifier 310 may then amplify the analog audio signal and split the analog audio signal into stereo channels. Stereo channels may refer to analog audio which is separated into two separate audio channels. In embodiments, the amount of amplification may be based on a desired gain set by the one or more processors 306. For example, the one or more processors 306 may receive a volume, balance, treble, or bass setting from the touchscreen panel 204a. The one or more processors 306 may then cause the power amplifier 310 to control the volume, balance, treble, or bass setting of the analog audio signal.

The audio jack 312 may be coupled to the power amplifier 310. The audio jack 312 may also be referred to as a headphone jack. The audio jack may also be configured to couple to an audio plug. The audio jack 312 may include a female jack configured to receive the audio plug (also referred to as a male connector). The audio jack may include a cylindrical groove configured to receive a cylindrical connector of the jack. The audio jack may include any audio jack, such as, but not limited to, a three-contact audio jack. The three-contact audio jack may also be referred to as a TRS audio jack. The three-contact audio jack may provide stereo audio output. The stereo audio output may be advantageous for providing stereo sound to headphones. The three-contact audio jack may include three contacts configured to interface with a tip, a ring, and a sleeve of the three-contact plug (e.g., TRS plug). The three-contacts may include, but are not limited to, a sleeve contact, a tip contact, and/or a ring contact. In embodiments, the audio jack 312 may include, but is not limited to, a 3.5 mm jack and the like. The audio jack 312 may be configured to receive any audio plug, such as, but not limited to a 3.5 mm audio plug. In embodiments, the audio jack 312 may receive the stereo analog audio from the power amplifier 310. In this regard, the audio jack 310 may receive both of the stereo audio from the power amplifier 310. The audio jack 312 may then output the stereo analog audio to the audio plug. In embodiments, the audio jack 312 is disposed in the cubic portion 218 of the audio converter 204b (see FIG. 2F for example).

In embodiments, the one or more processors 306 may be coupled to the audio jack 312. For example, the one or more processors 306 may be coupled to the audio jack 312 by a signal line 318. As depicted, the signal line 318 may be coupled to a contact of the audio jack 312. The audio jack 312 may be configured to detect the audio plug is coupled to the audio jack 312. For example, the signal line 318 may be switched on or grounded when the audio plug is inserted into the audio jack 312. The audio jack 312 may then transmit one or more signals to the one or more processors 306 indicating whether the audio plug is coupled to the audio jack 312. For example, the audio jack 312 may transmit a first signal to the one or more processors 306, where the first signal indicates the audio plug is coupled to the audio jack 312. By way of another example, the audio jack 312 may detect the audio plug is not coupled to the audio jack 312 and transmit a second signal to the one or more processors 306, where the second signal indicates the audio plug is not coupled to the audio jack 312. In embodiments, the program instructions cause the one or more processors 306 to transmit the digital audio signal to the digital-to-analog converter 314 in response to receiving the first signal. In this regard, the digital audio signal is transmitted when the plug is detected. The program instructions may also cause the one or more processors 306 to not transmit the digital audio signal to the digital-to-analog converter in response to receiving the second signal. In this regard, the digital audio signal is not transmitted when no plug is detected, thereby saving the digital-to-analog converter from using power.

In embodiments, the network interface 302 includes two sets of single pair ethernet. A first single pair ethernet may be considered an input port. A second single pair ethernet may be considered an output port. In embodiments, the audio converter 204b is configured to function as a network switch. A network switch may refer to a device configured to receive packets and forward the packets to a desired destination. The program instructions may cause the one or more processors 306 to function as a network switch between the input port and the output port. The program instructions may cause the audio converter 204b to forward the packets to the network 106. For example, the audio converter 204b may include a first ethernet port and a second ethernet port. The processors 306 may receive the packets from the first ethernet port. The program instructions may configure the one or more processors to forward the plurality of packets to the second ethernet port. The ability for the audio converter 204b to function as a network switch may be particularly advantageous in the context of in-flight entertainment systems. In embodiments, multiple of the audio converters 204b may be connected in series. Connecting multiple of the audio converters 204b in series may be referred to as daisy-chaining the audio converters 204b.

In embodiments, the one or more processors 306 may send the one or more signals indicating whether the audio plug is coupled to network 106 and/or to the cabin controller 102. For example, the processor may send a status message to the cabin controller 102 by the network 106. The status message may indicate the audio jack 312 does or does not include the headphone plug inserted. The cabin controller 102 may then use the status messages for troubleshooting purposes. For example, the cabin controller 102 may generate a display indicating which seats have headphone plugged in and which seats do not have headphone plugged in. A flight attendant may receive a complaint that the headphones are not working for a seat. The flight attendant may look at the display to determine whether the headphones are plugged in properly without having to leave the display (e.g., without having to walk to the seat). In embodiments, the cabin controller 102 may use the status message for system optimization. For example, a branch of the network 106 may not include any headphones plugged in. As used herein branch may refer to the daisy-chain of the audio converters 204b which are connected between the cabin controllers 102. The cabin controllers 102 may receive the status messages from each of the audio converters 204b. The cabin controllers 102 may then may detect that no headphones are plugged in on the network 106. The cabin controllers 102 may then not send any audio over the network 106 in response to detecting that no headphones are plugged in. Thus, the cabin controllers 102 may save the resources by not sending the packets including the digital audio signal. The processing resources saved may include processing resources from the one or more processors 306 associated with assembling the digital audio signal from the packets. Saving the processing resources of the audio converter 204b may be beneficial to reduce the power consumption of the system 100. Similarly, the status message may indicate the audio plug is inserted in the audio jack 312. The cabin controllers 102 may be configured to send the packets over the network 106 in response to receiving the status message indicating the audio plug is inserted in the audio jack 312.

In embodiments, the one or more processors 306 may receive one or more control signals. The control signals may cause the one or more processors 306 to adjust the gain of the power amplifier 310 and similarly the volume output for the analog audio signal. For instance, the one or more processors 306 may receive the control signals by way of the network 106. Said controls signals received by way of the network 106 may originate from one or more of the touch panels 204a or a controller which is not co-located with the audio converter 204b. Said controls signals may also cause the one or more processors 306 to switch to announcements and/or safety briefings when commanded. By way of another instance, the control signals may be received by a wireless receiver (not depicted) of the audio converter 204b. Said controls signals may be transmitted over a wireless communication from a user equipment (UE), such as, but not limited to, a mobile phone. Thus, the control signals may originate from various sources such as a mobile phone or cabin touch screen.

Referring generally again to FIGS. 1-3.

In embodiments, the cabin controller 102 may be referred to as a cabin controller line-replaceable unit (LRU). In embodiments, cabin controller 102 may include Rapid Spanning Tree Protocol (RSTP) functionality. The RSTP functionality may allow the cabin controller 102 to dynamically reconfigure the network 106 around network failures of one or more of the assemblies 104.

In embodiments, the housing 104 may include a cover-plate (not depicted). The cover-plate may cover the opening to prevent access to the cavity 212. The housing 104 may include the to take up excess space in the cavity 212 which is not currently receiving one of the modules 204.

In embodiments, any of the various component described herein may meet DO-160 G qualification, such as, but not limited to, for environmental and electromagnetic qualifications. In embodiments, any of the various components described herein may be qualified to operate from −15° C. to 55° C. In embodiments, any of the various components described herein may be qualified to operate at altitudes of 15,000 ft. In embodiments, any of the various components described herein may be qualified to meet Category S and/or Curve C for vibration testing.

It is noted that where the cabin management system 100 is installed within the aircraft, the cabin management system 100 may be configured in accordance with aviation guidelines and/or standards put forth by, but not limited to: the Federal Aviation Administration (FAA), the European Aviation Safety Agency (EASA), or any other flight certification agency or organization; the American National Standards Institute (ANSI) or any other standards setting organization or company; and the like.

Although much of the present disclosure is directed to the system 100 being installed within the aircraft or aircraft cabin, it is noted herein the system 100 may be installed within any number of environments. For example, the environment may include any type of vehicle known in the art. For instance, the vehicle may be any air, land, or water-based personal equipment or vehicle; any air, land, or water-based commercial equipment or vehicle; any air, land, or water-based military equipment or vehicle known in the art. By way of another example, the environment may include a commercial or industrial establishment (e.g., a home or a business).

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

From the above description, it is clear that the inventive concepts disclosed herein are well adapted to carry out the objects and to attain the advantages mentioned herein as well as those inherent in the inventive concepts disclosed herein. While presently preferred embodiments of the inventive concepts disclosed herein have been described for purposes of this disclosure, it will be understood that numerous changes may be made which will readily suggest themselves to those skilled in the art and which are accomplished within the broad scope and coverage of the inventive concepts disclosed and claimed herein.

What is claimed:

1. An audio converter comprising:
a network interface comprising a first ethernet port configured to receive a plurality of packets;
one or more processors coupled to the network interface, wherein the one or more processors are configured to execute program instructions maintained on a memory medium causing the one or more processors to assemble the plurality of packets into a digital audio signal;
a digital-to-analog converter coupled to the one or more processors, wherein the digital-to-analog converter is configured to receive the digital audio signal and convert the digital audio signal to an analog audio signal;
a power amplifier coupled to the digital-to-analog converter, wherein the power amplifier is configured to receive the analog audio signal from the digital-to-analog converter, amplify the analog audio signal, and split the analog audio signal into a stereo analog audio;
an audio jack coupled to the power amplifier and configured to couple to an audio plug, wherein the audio jack is configured to receive the stereo analog audio from the power amplifier and output the stereo analog audio to the audio plug; and
a first cubic portion and a second cubic portion coupled to the first cubic portion, wherein the first cubic portion comprises a face which extends from the second cubic portion, wherein the face of the first cubic portion extends around a perimeter of the second cubic portion such that the first cubic portion is configured as a bezel portion for the second cubic portion, wherein the audio jack is disposed in the first cubic portion, wherein the network interface is disposed in the second cubic portion, wherein the first cubic portion is wider and longer than the second cubic portion, wherein the first cubic portion and the second cubic portion are concentric.

2. The audio converter of claim 1, comprising one or more threaded inserts, wherein the one or more threaded inserts are coupled to a side of the second cubic portion.

3. The audio converter of claim 1, wherein the network interface comprises a second ethernet port, wherein the program instructions configure the one or more processors to forward the plurality of packets to the second ethernet port.

4. The audio converter of claim 1, wherein the audio jack is a 3.5 mm audio jack.

5. The audio converter of claim 4, wherein the one or more processors are coupled to the audio jack, wherein the audio jack is configured to detect the audio plug is coupled to the audio jack and transmit a first signal to the one or more processors, wherein the first signal indicates the audio plug is coupled to the audio jack, wherein the audio jack is configured to detect the audio plug is not coupled to the audio jack and transmit a second signal to the one or more processors, wherein the second signal indicates the audio plug is not coupled to the audio jack.

6. The audio converter of claim 5, wherein the program instructions cause the one or more processors to transmit the digital audio signal to the digital-to-analog converter in response to receiving the first signal, wherein the program instructions cause the one or more processors to stop transmitting the digital audio signal to the digital-to-analog converter in response to receiving the second signal.

7. The audio converter of claim 1, wherein the digital audio signal comprises a linear pulse code modulation (LPCM) digital audio signal, wherein the digital-to-analog converter is configured to convert the linear pulse code modulation digital audio signal to the analog audio signal.

8. The audio converter of claim 1, wherein the one or more processors are configured to execute a communication protocol for assembling the plurality of packets into the digital audio signal, wherein the communication protocol comprises one of transmission control protocol/internet protocol (TCP/IP) or user datagram protocol (UDP).

9. A system comprising:
a network;
one or more cabin controllers configured to send a plurality of packets over the network;
a plurality of assemblies, the plurality of assemblies each comprising:
a housing; and
an audio converter comprising:
a network interface comprising a first ethernet port configured to receive the plurality of packets from the network;
one or more processors coupled to the network interface, wherein the one or more processors are configured to execute program instructions maintained on a memory medium causing the one or more processors to assemble the plurality of packets into a digital audio signal;
a digital-to-analog converter coupled to the one or more processors, wherein the digital-to-analog converter is configured to receive the digital audio signal and convert the digital audio signal to an analog audio signal;
a power amplifier coupled to the digital-to-analog converter, wherein the power amplifier is configured to receive the analog audio signal from the digital-to-analog converter, amplify the analog audio signal, and split the analog audio signal into a stereo analog audio;
an audio jack coupled to the power amplifier and configured to couple to an audio plug, wherein the audio jack is configured to receive the stereo analog audio from the power amplifier and output the stereo analog audio to the audio plug; and
a first cubic portion and a second cubic portion coupled to the first cubic portion, wherein the first cubic portion comprises a face which extends from the second cubic portion, wherein the face of the first cubic portion extends around a perimeter of the second cubic portion such that the first cubic portion is configured as a bezel portion for the second cubic portion, wherein the audio jack is disposed in the first cubic portion, wherein the network interface is disposed in the second cubic portion, wherein the first cubic portion is wider and longer than the second cubic portion, wherein the first cubic portion and the second cubic portion are concentric.

10. The system of claim 9, the audio converter comprising one or more threaded inserts, wherein the one or more threaded inserts are coupled to a side of the second cubic portion, the plurality of assemblies each comprising one or more fasteners coupling the housing to the audio converter by the one or more threaded inserts.

11. The system of claim 9, the housing comprising walls and a bezel, wherein the bezel defines a first cavity, wherein the walls define a second cavity, wherein the walls and the bezel are coupled, wherein the first cubic portion is received in the first cavity, wherein the second cubic portion is received in the second cavity, wherein the face of the first cubic portion abuts the walls, wherein the audio converter is flush-mounted to the housing such that the bezel and the first cubic portion form a flush surface.

12. The system of claim 9, the plurality of assemblies each comprising a touch panel, wherein the touch panel is flush-mounted to the housing, wherein the touch panel is configured to control a volume of the stereo analog audio.

13. The system of claim 9, wherein the network interface comprises a second ethernet port, wherein the network comprises a daisy-chain network topology connecting the audio converter of each of the plurality of assemblies.

14. The system of claim 9, wherein the audio converter is configured to transmit a status message to the one or more cabin controllers, wherein the status message indicates the audio plug is inserted in the audio jack, wherein the one or more cabin controllers sends the packets over the network in response to receiving the status message.

\* \* \* \* \*